(12) United States Patent
Straub

(10) Patent No.: US 6,573,802 B2
(45) Date of Patent: Jun. 3, 2003

(54) SINGLE-ENDED TO DIFFERENTIAL AND DIFFERENTIAL TO SINGLE-ENDED CONVERSION USING A COMMON MODE SHUNT

(75) Inventor: A. Michael Straub, Indialantic, FL (US)

(73) Assignee: Intersil Americas Inc., Milpitas, CA (US)

(*) Notice: Subject to any disclaimer, the term of this patent is extended or adjusted under 35 U.S.C. 154(b) by 0 days.

(21) Appl. No.: 09/944,000

(22) Filed: Aug. 31, 2001

(65) Prior Publication Data

US 2002/0065040 A1 May 30, 2002

Related U.S. Application Data

(60) Provisional application No. 60/250,598, filed on Nov. 30, 2000.

(51) Int. Cl.[7] ............................................... H03H 7/42
(52) U.S. Cl. ............................ 333/25; 333/32; 330/301
(58) Field of Search ....................... 333/25, 32; 326/68; 330/260, 301, 257; 327/103

(56) References Cited

U.S. PATENT DOCUMENTS

| | | | | |
|---|---|---|---|---|
| 4,517,525 A | * | 5/1985 | Dijkmans et al. ............ 330/260 |
| 4,755,766 A | * | 7/1988 | Metz ............................ 330/257 |
| 4,766,402 A | * | 8/1988 | Crane ........................... 333/25 |
| 5,541,532 A | * | 7/1996 | McCall ......................... 326/68 |
| 5,945,878 A | * | 8/1999 | Westwick et al. ............ 333/301 |
| 6,150,852 A | * | 11/2000 | Aparin ......................... 327/103 |
| 6,285,259 B1 | * | 9/2001 | Franck et al. ................ 330/301 |
| 6,437,657 B1 | * | 8/2002 | Jones ............................ 333/25 |

OTHER PUBLICATIONS

PCT Notification of Transmittal of the International Search Report or the Declaration, dated Jul. 22, 2002, 7 pages.
Lorenz C Aktiengesellschaft, FR 868 474 A, Dec. 31, 1941, p. 1, right–hand column, line 41—p. 2, left–hand column, line 37; figure 1, Paris (FR 868 474 A).
W Van B Roberts, "A Neglected Form of Balun," QST Amateur Radio, vol. 53, No. 4, Apr. 1, 1969, p. 48, left–hand column, line 6—right–hand column, line 2 (XP002205295).
Adler D, et al, "Broadband Switched–Bit Phase Shifter Using All–Pass Networks," Microwave Symposium Digest, 1991, IEEE, MTT–S International Boston, MA, USA 10–14, Jun. 1991, New York, NY, USA, IEEE, US, Jun. 10, 1991, pp. 265–268, ISBD: 0–87942–591–1, figures 1–3 (XP010037629).

* cited by examiner

Primary Examiner—Patrick Wamsley
(74) Attorney, Agent, or Firm—Gary R. Stanford

(57) ABSTRACT

A single-ended to differential converter including a common mode shunt and a load element. The common mode shunt includes first and second reactive elements each having first ends coupled together at a common mode junction. The second end of the first reactive element receives a single-ended input signal referenced to a reference signal, such as ground. The common mode shunt further includes a third reactive element coupled between the common mode junction and ground. The load element is coupled between the second end of the second reactive element and ground. A single-ended input signal is applied at a second end of the first reactive element and the differential signal is developed by the first and second reactive elements. The common mode shunt serves as a differential to single-ended converter by applying the differential signal as an input in which a single-ended output signal develops at the load element.

25 Claims, 4 Drawing Sheets

SINGLE-ENDED TO DIFFERENTIAL AND DIFFERENTIAL TO SINGLE-ENDED CONVERSION USING A COMMON MODE SHUNT

CROSS-REFERENCE TO RELATED APPLICATION(S)

The present application is based on U.S. Provisional Patent Application entitled "Singe-Ended to Differential and Differential to Single-Ended Conversion Using A Common Mode Shunt", Ser. No. 60/250,598, filed Nov. 30, 2000, which is hereby incorporated by reference in its entirety. The present application is related to U.S. patent application entitled "Quadrature Oscillator With Phase Error Correction", Ser. No. 09/747,163, filed Dec. 21, 2000, which is hereby incorporated by reference in its entirety.

FIELD OF THE INVENTION

The present invention relates to electronic signal conversion, and more specifically, to the conversion of single-ended signals to differential signals and differential signals to single-ended signals using a common mode shunt.

DESCRIPTION OF RELATED ART

The advantages of differential circuits are well known especially when incorporated into RF integrated circuits. Often the input and/or output signal needs to be single-ended. The use of differential circuits in this case requires the use of some single-ended to differential conversion. The differential transistor pair is a circuit often used to convert single-ended inputs to differential signals. This circuit does not work well if the current source biasing the differential pair does not have a high impedance at high frequencies. A balanced/unbalanced (BALUN) impedance matching network is a type of high frequency transformer that can be used for differential/single-ended conversions. The BALUN, however, is moderately expensive and bulky. Various transmission line combiners are also known.

SUMMARY OF THE INVENTION

A single-ended to differential converter in accordance with an embodiment of the present invention includes a common mode shunt having a common mode junction and a load element. The common mode shunt includes first and second reactive elements each having first ends coupled together at the common mode junction. The second end of the first reactive element receives a single-ended input signal referenced to a reference signal. The second ends of both of the first and second reactive elements develop first and second polarities, respectively, of a differential output signal. The common mode shunt further includes a third reactive element having a first end coupled to the common mode junction and a second end referenced to the reference signal. The load element has a first end coupled to the second end of the second reactive element and a second end referenced to the reference signal.

The reference signal may be ground or any other suitable common signal serving as a voltage reference for the single-ended input signal. In one embodiment, for example, the load element and the third reactive elements are both coupled to ground. An input source provides the single-ended input signal to the second end of the first reactive element. In one embodiment, the input source includes a series-coupled input impedance element. The load element and the series-coupled input impedance element may be resistors having approximately the same resistance. The first and second reactive elements of the common mode shunt may have approximately the same impedance. In a particular embodiment, the first and second reactive elements are inductors and the third reactive element is a capacitor. In this embodiment, the inductors may each have approximately the same inductance. In the same or alternative embodiment, the first and second reactive elements have an impedance of approximately Z, and the third reactive element has an impedance of approximately $-0.5Z$. This is easily achieved using inductive and capacitive elements.

A differential to single-ended converter in accordance with an embodiment of the present invention also includes a common mode shunt and a load element. In fact, the configuration may be substantially identical, except that the second ends of the first and second reactive elements receive first and second polarities, respectively, of a differential input signal and the second end of the second reactive element develops a single-ended output signal.

Again, the reference signal may be ground. The first and second reactive elements of the common mode shunt may have approximately the same impedance. The first and second reactive elements may be inductors and the third reactive element may be a capacitor. The inductors may each have approximately the same inductance. The differential input signal may be current-based polarity signals, and may be developed by a differential pair of transistors. A fourth reactive element having an impedance of approximately $-2Z$ may be coupled between the second ends of the first and second reactive elements, where the first and second reactive elements each have an impedance of approximately Z.

BRIEF DESCRIPTION OF THE DRAWINGS

A better understanding of the present invention(s) can be obtained when the following detailed description of embodiment(s) of the invention(s) is considered in conjunction with the following drawings, in which.

DETAILED DESCRIPTION OF EMBODIMENT(S) OF THE INVENTION

Figure 1:
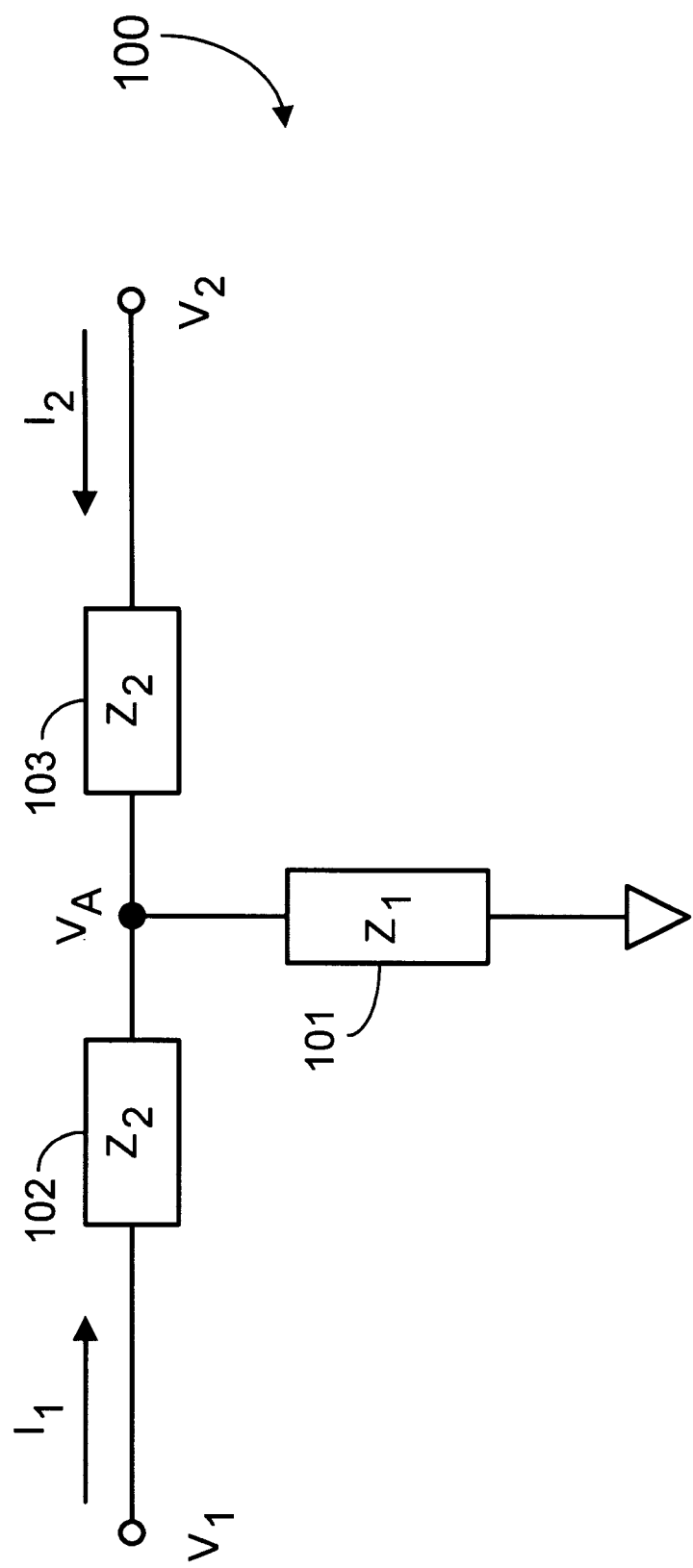
FIG. 1 is a block diagram of an exemplary common mode shunt implemented according to an embodiment of the present invention.

FIG. 1 is a block diagram of an exemplary common mode shunt 100 implemented according to an embodiment of the present invention. The common mode shunt 100 includes three reactive elements 101, 102 and 103 with impedances $Z_1$, $Z_2$ and $Z_2$, respectively. The impedances of elements 102 and 103 are approximately the same. The reactive elements 101–103 may each be single reactive elements or combinations of reactive elements. Examples of reactive elements include capacitors, inductors and variations or derivatives thereof, such as transformers or the like. The element 101 has one end coupled to a ground reference signal and its other end coupled to a voltage terminal $V_A$ (having voltage $V_A$). It is noted that "ground" serves a common reference signal where it is understood that any reference signal other than ground may be used. The other two elements 102, 103 each have one end connected to the $V_A$ terminal. The element 102 has its other end coupled to a voltage terminal $V_1$ (having voltage $V_1$) and the element 103 has its other end coupled to a voltage terminal $V_2$ (having voltage $V_2$). A current $I_1$ is defined flowing from the $V_1$ terminal to the $V_A$ terminal through the element 102 and a current $I_2$ is defined flowing from the $V_2$ terminal to the $V_A$ terminal through the element 103. The currents $I_1$ and $I_2$ both flow through the element 101. The relationships between the voltages and currents are further defined in the following equations 1, 2 and 3:

$$V_A = (I_1 + I_2) Z_1 \quad \text{(EQ 1)}$$

$$V_1 = I_1 Z_2 + V_A = I_1 Z_2 + (I_1 + I_2) Z_1 \quad \text{(EQ 2)}$$

$$V_2 = I_2 Z_2 + V_A = I_2 Z_2 + (I_1 + I_2) Z_1 \quad \text{(EQ 3)}$$

Equations 2 and 3, when added together, define a common mode voltage $V_{CM}$ that is twice the common mode (i.e. average voltage) of the voltages $V_1$ and $V_2$ as illustrated by the following equation 4:

$$V_1 + V_2 = I_1 Z_2 + I_2 Z_2 + 2(I_1 + I_2) Z_1 = (I_1 + I_2)(Z_2 + 2Z_1) = 2V_{CM} \rightarrow V_{CM} = (V_1 + V_2)/2 \quad \text{(EQ 4)}$$

where the forward slash "/" denotes division. The common mode voltage $V_{CM}$ is zero even if the sum of the currents $I_1$ and $I_2$ is not zero as long as the common mode impedance is zero as illustrated by following equation 5:

$$V_1 + V_2 = 0 \rightarrow Z_2 + 2Z_1 = 0 \quad \text{(EQ 5)}$$

For example, if $Z_1$ is an inductor with inductance $L_1$ and $Z_2$ is a capacitor with capacitance $C_2$, then at some frequency ($\omega$) their common mode impedance would be zero as illustrated by the following equation 6:

$$Z_1 = j\omega L_1 \ Z_2 = -j/\omega C_2 \ j\omega 2L_1 - j/\omega C_2 = 0 \rightarrow \omega^2 = 1/2L_1 C_2 \quad \text{(EQ 6)}$$

An exemplary embodiment for single-ended to differential conversion at a frequency of 5 gigahertz (GHz) is $L_1$=approximately 1 nanohenry (nH) and $C_2$=approximately 0.5 picofarads (pF). The only way that the common mode voltage can be zero is that the two terminal voltages $V_1$ and $V_2$ are differential, i.e. having approximately the same magnitude but opposite sign as illustrated by the following equation 7:

$$V_1 + V_2 = 0 \rightarrow V_2 = -V_1 \quad \text{(EQ 7)}$$

At an operating frequency (jω), the common mode shunt 100 establishes a pair of voltages at the $V_1$ and $V_2$ terminals that are equal in magnitude and 180° out of phase, independent of the terminal currents $I_1$ and $I_2$. If the common mode shunt 100 is connected between the bases of a differential pair, such as a differential pair of bipolar junction transistors (BJTs), then the differential pair can be driven from one side without impressing a common mode voltage on the current source/sink biasing the common emitter/source node. It is desired that the differential pair have a high common mode impedance as seen from the common emitters back to the source at the operating frequency.

Figure 2:
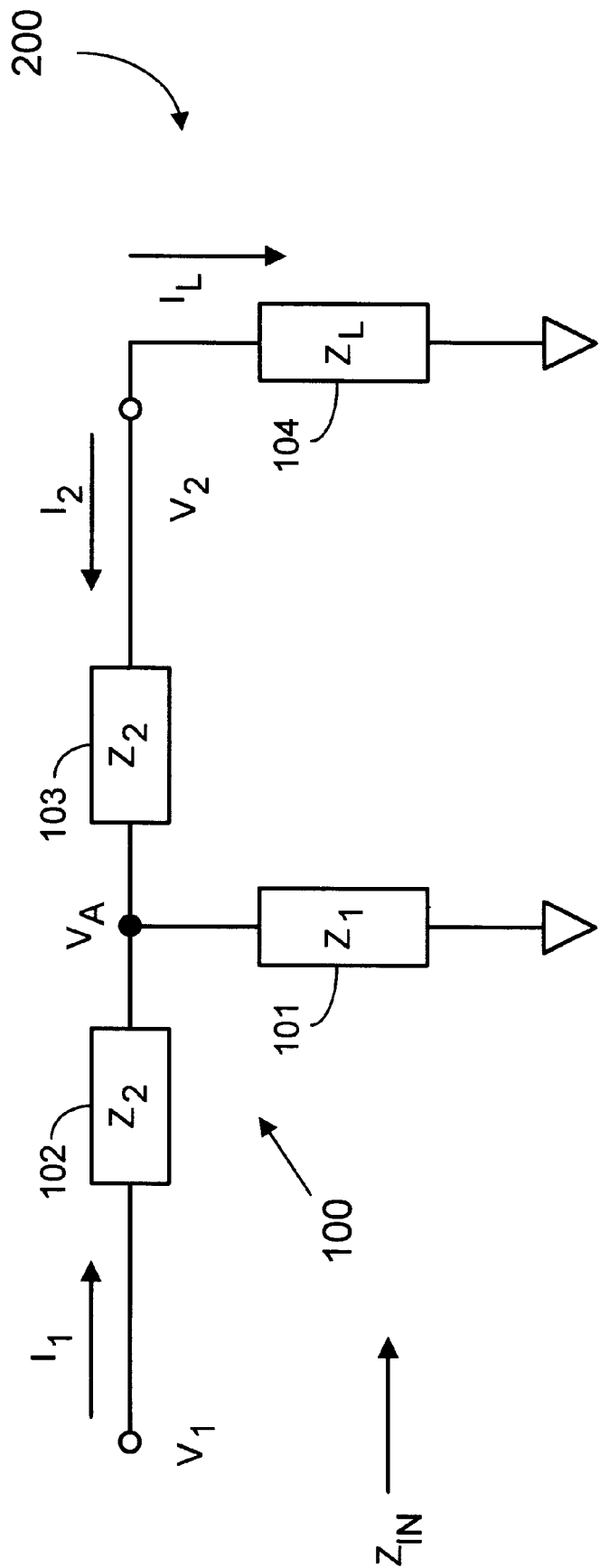
FIG. 2 is a block diagram of a single-ended to differential converter network using the common mode shunt of FIG. 1 coupled to a load element.

FIG. 2 is a block diagram of a single-ended to differential converter network 200 using the common mode shunt 100 coupled to a load element 104 with impedance $Z_L$. The converter network 200 is driven at the $V_1$ terminal (with input impedance $Z_{IN}$) and the load element 104 is coupled between the $V_2$ terminal and ground. A load current $I_L$ is defined as flowing from the $V_2$ terminal to ground through load element 104.

Subtracting equation 3 from equation 2 yields the following equations 8 and 9:

$$V_1 - V_2 = 2V_1 = I_1 Z_2 - I_2 Z_2 = (I_1 - I_2) Z_2 \quad \text{(EQ 8)}$$

$$I_L = -I_2 = V_2/Z_L = -V_1/Z_L \quad \text{(EQ 9)}$$

The following equations 10 and 11 illustrate substituting the load current relationship for $I_2$ and solving for $I_1$ to define the input impedance $Z_{IN}$:

$$2V_1 = (I_1 - V_1/Z_L) Z_2 \rightarrow I_1 = 2V_1/Z_2 + V_1/Z_L \quad \text{(EQ 10)}$$

$$Z_{IN} = V_1/I_1 = V_1/(2V_1/Z_2 + V_1/Z_L) = Z_L(Z_2/2)/(Z_L + Z_2/2) = Z_L \| (Z_2/2) \quad \text{(EQ 11)}$$

In this manner, the input impedance $Z_{IN}$ is the parallel combination of the load impedance $Z_L$ and half of the impedance $Z_2$ of the element 103. In another embodiment, a matching element of $-0.5Z_2$ is connected between the input terminal $V_1$ and the output terminal $V_2$ to achieve a similar effect.

Figure 3:
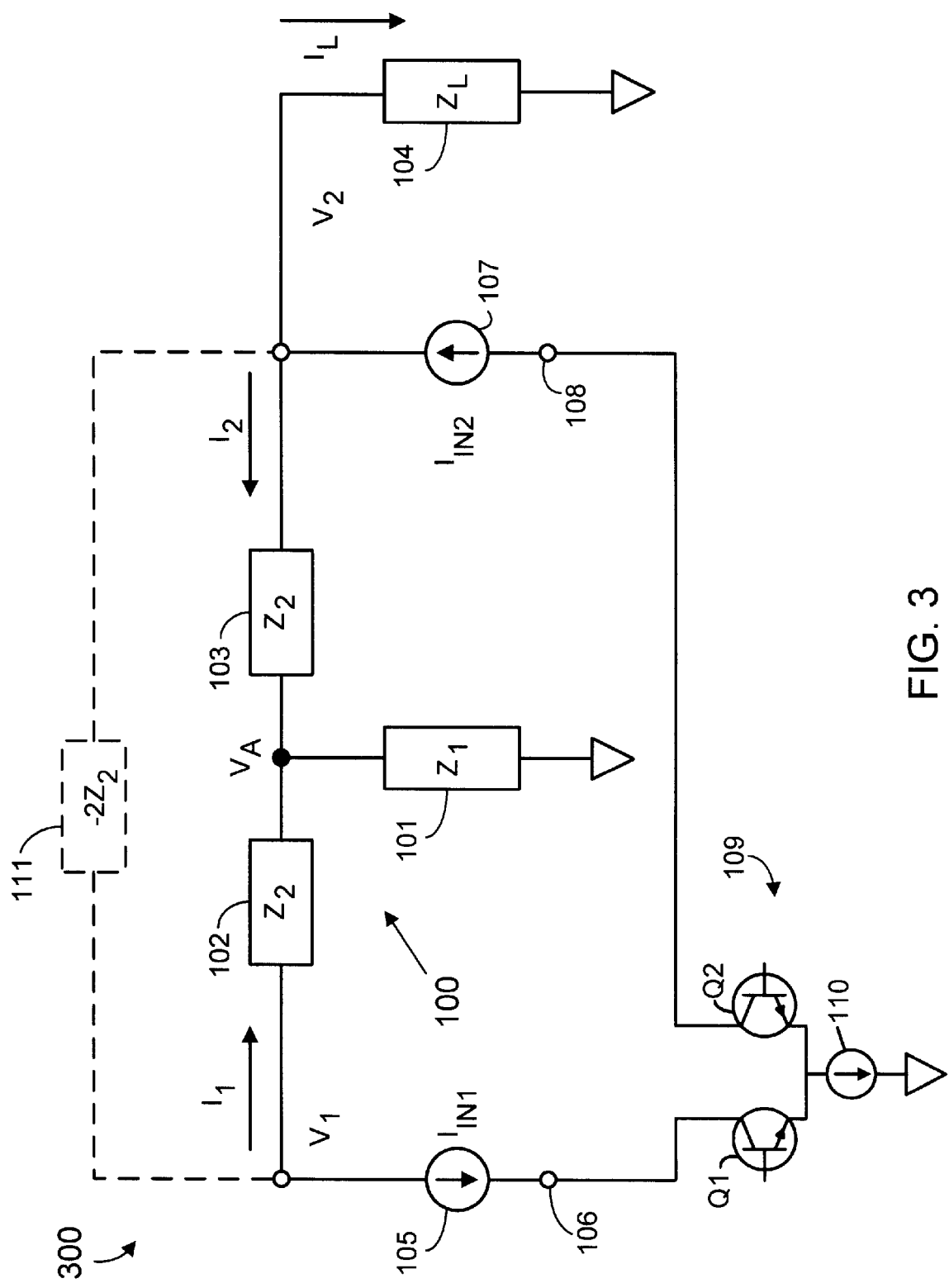
FIG. 3 is a block diagram of an exemplary differential to single-ended power combiner implemented according an embodiment of the present invention using the common mode shunt of FIG. 1.

FIG. 3 is a block diagram of an exemplary differential to single-ended power combiner 300 implemented according to an embodiment of the present invention using the common mode shunt 100. It is often desirable to combine the output currents from a differential circuit and apply the combined output currents to a load. The two currents are ideally equal but 180° out of phase with respect to each other, such as the collector/drain currents from a differential transistor pair. The power combiner 300 includes the common mode shunt 100 coupled to the load element 104 in a similar manner as described for the converter network 200. Furthermore, the power combiner 300 includes a first current source 105 coupled between terminals 106 and $V_1$ with a current $I_{IN1}$ flowing from the $V_1$ terminal to a terminal 106 and a second current source 107 coupled between terminals 108 and $V_2$ with a current $I_{IN2}$ flowing from the terminal 108 to the $V_2$ terminal. The current sources 105 and 107 collectively represent the output of a differential pair since each transistor of the differential pair has relatively high output impedance.

For example, a pair of bipolar junction transistors (BJTs) Q1 and Q2 forming a differential pair 109 are shown coupled to the differential to single-ended power combiner 300. The BJTs Q1 and Q2 have their emitters coupled together and to one end of a current source 110, having its other end coupled to ground. The collectors of the BJTs Q1 and Q2 are coupled to terminals 106 and 108 to illustrate the coupling to the differential to single-ended power combiner 300.

In this manner, the current sources 105, 107 representing the output of a differential pair are coupled to both sides of the common mode shunt 100, whereas the load element 104 is coupled to only one side, such as the $V_2$ terminal as shown. The following equation 12 illustrates the relationship of currents $I_1$ and $I_2$ with respect to the input currents $I_{IN1}$ and $I_{IN2}$ and the load current $I_L$:

$$I_1 = -I_{IN1} \ I_2 = I_{IN2} - I_L \quad \text{(EQ 12)}$$

Substituting equation 12 into equation 8 provides the relationships illustrated in the following equations 13, 14 and 15:

$$2V_1 = [-I_{IN1} - (I_{IN2} - I_L)] Z_2 = Z_2 (V_2/Z_L) - (I_{IN1} + I_{IN2}) Z_2 \quad \text{(EQ 13)}$$

$$(I_{IN1}+I_{IN2})Z_2=Z_2(V_2/Z_L)+2V_2 \rightarrow V_2=[Z_L(Z_2/2)/(Z_2/2+Z_L)](I_{IN1}+I_{IN2})=$$
$$((Z_2/2)\|Z_L)(I_{IN1}+I_{IN2}) \quad \text{(EQ 14)}$$

$$I_L=V_2/Z_L=[(Z_2/2)/(Z_2/2+Z_L)](I_{IN1}+I_{IN2}) \quad \text{(EQ 15)}$$

Since both terminal voltages $V_1$ and $V_2$ are approximately equal in magnitude and out of phase, when the source currents $I_{IN1}$ and $I_{IN2}$ are also equal in magnitude and out of phase, the effective impedance as seen by each source of the differential pair is the same. It is noted that equation 15 shows that both sources contribute equally to the load current $I_L$. It is also noted that the addition of suitable matching components can scale the ratio of load current $I_L$ to source current $I_{IN1}$, $I_{IN2}$. For example, in an alternative embodiment, a matching element 111 of $-2Z_2$ is shown with dashed lines coupled between the two terminals $V_1$ and $V_2$ making the load current $I_L$ equal to the sum of the two source currents $I_{IN1}$ and $I_{IN2}$.

Again, it is noted that the common mode shunt 100 employed for the exemplary single-ended to differential converter network 200 or the exemplary differential to single-ended power combiner 300 is configured using reactive components, such as inductive or capacitive components or the like. For example, the elements 102 and 103 may be inductive elements while the element 101 is a capacitive element, or the elements 102 and 103 may be capacitive elements while the element 101 is an inductive element.

Figure 4:
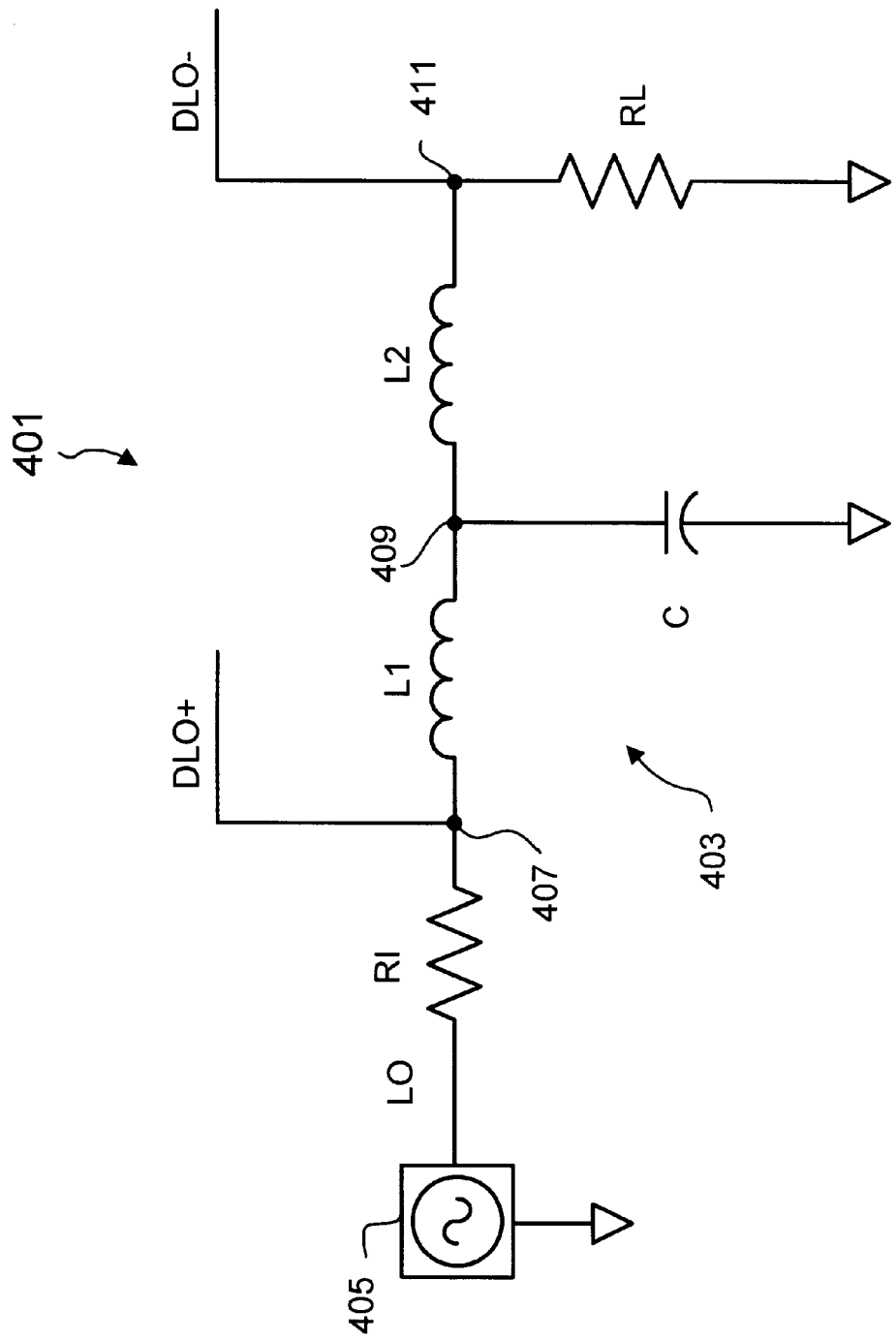
FIG. 4 is a schematic diagram of an oscillator circuit employing a single-ended to differential converter according to an embodiment of the present invention configured as a common mode shunt using inductive and capacitive reactive components.

FIG. 4 is a schematic diagram of an oscillator circuit 401 employing a single-ended to differential converter 403 configured as a common mode shunt using inductive and capacitive reactive components. An oscillator 405 asserts a single-ended sinusoidal local oscillator (LO) signal to one end of an input resistor RI, which has its other end coupled to an input/output (I/O) terminal 407 of the converter 403. The oscillator 405 and the input resistor RI form an RF source. The converter 403 includes a first inductor L1 coupled between the I/O terminal 407 and a common mode junction 409, a second inductor L2 coupled between the common mode junction 409 and another output terminal 411, and a capacitor C coupled between the common mode junction 409 and ground. A load resistor RL is coupled to the output terminal 411 and ground. The output terminals 407, 411 develop a differential LO signal with separate polarity signals DLO+ and DLO−, respectively, as shown.

The I/O terminal 407 of the converter 403 is driven by the RF source, the capacitor C provides a common mode return to ground via the common mode junction 409, and the load resistor RL functions as a reference for the differential signal at RF. In one embodiment, the inductances of the inductors L1 and L2 are approximately the same. The resistors RI and RL may provide a reasonable conjugate match that converts the single-ended LO signal to the differential signals DLO+ and DLO− by shunting a common mode portion of the differential signal through the common mode junction 409, which functions as the RF return back to the RF source. In one embodiment, the resistors RI and RL are impedance matching resistors having the same resistive value.

It is noted that the inductors L1 and L2 and the capacitor C of the converter 403 may be implemented using separate physical devices, or may be implemented using parasitic elements that may be inherently present on a printed circuit board (PCB) or integrated circuit (IC) or the like. For example, either or both of the inductors L1, L2 may be implemented using parasitic inductance, or the capacitor C may be implemented using parasitic capacitance, if available on an IC package rather than using physical devices. The use of inherent or parasitic elements saves cost and valuable IC space. The configuration of the converter 403 has an inherent advantage in that if DC bias is desired or necessary, it may be applied at the common mode junction 409. It is noted, however, that DC bias is not a requirement of the present invention. An alternative embodiment is contemplated in which the inductors L1, L2 are replaced with capacitors C1, C2, respectively and in which the capacitor C is replaced by an inductor. Again, parasitic values may be used for any or all of the elements if available and if desired. Such configuration potentially saves time and space since only one inductor (inductors usually being larger and more expensive than capacitors) is used. Such configuration, however, has the disadvantage in that if DC bias is desired or necessary, separate DC biases may need to be applied at the terminals 407 and 411.

Although a system and method according to the present invention has been described in connection with one or more embodiments, it is not intended to be limited to the specific form set forth herein, but on the contrary, it is intended to cover such alternatives, modifications, and equivalents, as can be reasonably included within the spirit and scope of the invention as defined by the appended claims.

What is claimed is:

1. A common mode shunt configured as a single-ended to differential converter, comprising:
   first and second reactive elements, each having a first end coupled together at a common mode junction;
   the first reactive element including a second end that receives a single-ended input signal referenced to a reference signal and that develops a first polarity of a differential output signal;
   the second reactive element including a second end that develops a second polarity of the differential output signal; and
   a third reactive element having a first end coupled to the common mode junction and a second end referenced to the reference signal.

2. The single-ended to differential converter of claim 1, further comprising:
   an input source, coupled to the second end of the first reactive element, that develops the single-ended input signal.

3. The single-ended to differential converter of claim 2, wherein the input source includes a series-coupled input impedance element having one end coupled to the second end of the first reactive element.

4. The single-ended to differential converter of claim 3, further comprising:
   a load element having a first end coupled to the second end of the second reactive element and a second end referenced to the reference signal; and
   wherein the load element and the series-coupled input impedance element are resistors having approximately the same resistance.

5. The single-ended to differential converter of claim 1, further comprising:
   a load element having a first end coupled to the second end of the second reactive element and a second end referenced to the reference signal.

6. The single-ended to differential converter of claim 5, wherein the second end of the third reactive element and the second end of the load element are each coupled to ground.

7. The single-ended to differential converter of claim 1, wherein the first and second reactive elements of the common mode shunt are inductors and wherein the third reactive element is a capacitor.

8. The single-ended to differential converter of claim 7, wherein the first and second inductors each have approximately the same inductance.

9. The single-ended to differential converter of claim 1, wherein the first and second reactive elements of the common mode shunt have approximately the same impedance.

10. The single-ended to differential converter of claim 1, wherein first and second reactive elements have an impedance of approximately Z, and wherein the third reactive element has an impedance of approximately −0.5Z.

11. The single-ended to differential converter of claim 1, wherein the first and second reactive elements of the common mode shunt are capacitors and wherein the third reactive element is an inductor.

12. A common mode shunt configured as a differential to single-ended converter, comprising:
   first and second reactive elements, each having a first end coupled together at a common mode junction;
   the first reactive element including a second end that receives a first polarity of a differential input signal;
   the second reactive element including a second end that receives a second polarity of the differential input signal and that develops a single-ended output signals; and
   a third reactive element having a first end coupled to the common mode junction and a second end referenced to the reference signal.

13. The single-ended to differential converter of claim 12, further comprising:
   a load element having a first end coupled to the second end of the second reactive element and a second end referenced to the reference signal.

14. The single-ended to differential converter of claim 13, wherein the second end of the third reactive element and the second end of the load element are each coupled to ground.

15. The single-ended to differential converter of claim 12, wherein the first and second reactive elements of the common mode shunt are inductors and wherein the third reactive element is a capacitor.

16. The single-ended to differential converter of claim 15, wherein the first and second inductors each have approximately the same inductance.

17. The single-ended to differential converter of claim 12, wherein the first and second reactive elements of the common mode shunt have approximately the same impedance.

18. The single-ended to differential converter of claim 12, wherein the first and second reactive elements of the common mode shunt are capacitors and wherein the third reactive element is an inductor.

19. The single-ended to differential converter of claim 12, wherein the differential input signal comprises current-based polarity signals.

20. The single-ended to differential converter of claim 12, wherein the differential input signal is developed by a differential pair of transistors.

21. The single-ended to differential converter of claim 12, wherein the first and second reactive elements each have an impedance of approximately Z, further comprising:
   a fourth reactive element having an impedance of approximately −2Z coupled between the second ends of the first and second reactive elements.

22. A method of employing a common mode shunt as a single-ended to differential converter, the common mode shunt including first, second and third reactive elements coupled together at a common mode junction and wherein the third reactive element is coupled to a reference signal, the method comprising:
   applying a single-ended signal, referenced to the reference signal, to the first reactive element; and
   receiving a differential signal across the first and second reactive elements.

23. The method of claim 22, further comprising:
   coupling a load element between the reference signal and the second reactive element.

24. A method of employing a common mode shunt as a differential to single-ended converter, the common mode shunt including first, second and third reactive elements coupled together at a common mode junction and wherein the third reactive element is coupled to a reference signal, the method comprising:
   applying a differential signal across the first and second reactive elements; and
   receiving a single-ended signal, referenced to the reference signal, from the second reactive element.

25. The method of claim 24, further comprising:
   coupling a load element between the reference signal and the second reactive element.

* * * * *